(12) United States Patent
May et al.

(10) Patent No.: US 7,026,840 B1
(45) Date of Patent: Apr. 11, 2006

(54) PROGRAMMABLE LOGIC DEVICE

(75) Inventors: Roger May, Bicester (GB); Andrew Crosland, Aylesbury (GB); Edward Flaherty, Kingston Bagpuize (GB)

(73) Assignee: Altera Corporation, San Jose, CA (US)

( * ) Notice: Subject to any disclaimer, the term of this patent is extended or adjusted under 35 U.S.C. 154(b) by 8 days.

(21) Appl. No.: 10/792,042

(22) Filed: Mar. 2, 2004

(51) Int. Cl.
*H03K 19/177* (2006.01)

(52) U.S. Cl. .............................. 326/38; 326/80; 326/41
(58) Field of Classification Search ............ 326/37–41; 365/226, 227
See application file for complete search history.

(56) References Cited

U.S. PATENT DOCUMENTS

| | | | |
|---|---|---|---|
| 5,808,942 A * | 9/1998 | Sharpe-Geisler | 365/189.08 |
| 6,102,963 A * | 8/2000 | Agrawal | 716/17 |
| 6,232,893 B1 * | 5/2001 | Cliff et al. | 341/78 |
| 6,384,628 B1 * | 5/2002 | Lacey et al. | 326/41 |
| 6,396,169 B1 * | 5/2002 | Voegeli et al. | 307/52 |
| 6,529,041 B1 * | 3/2003 | Ng et al. | 326/40 |
| 6,710,621 B1 * | 3/2004 | Devlin et al. | 326/38 |

\* cited by examiner

*Primary Examiner*—Vibol Tan
(74) *Attorney, Agent, or Firm*—Townsend and Townsend and Crew, LLP

(57) ABSTRACT

A programmable logic device is provided with multiple power supplies such that, in one mode of operation, power can be disconnected from at least one part of the programmable logic device, while maintaining power at least to an interface component of the programmable logic device, or to a memory component in which current configuration data are stored, thereby avoiding the need for a configuration sequence when power is reapplied to the whole device. The programmable logic device may be provided as an integrated circuit, having multiple pairs of pins for connection to a supply voltage. Each of the pairs of pins provides power for a different subsection of the programmable logic device.

25 Claims, 2 Drawing Sheets

PROGRAMMABLE LOGIC DEVICE

BACKGROUND OF THE INVENTION

This invention relates to a programmable logic device (PLD) or field programmable gate array (FPGA). In particular, it relates to the implementation of a power source for the device.

A programmable logic device is an integrated circuit, which includes a large number of logic elements, usually arranged in the form of an array. After manufacture, these logic elements can be combined, by programming the possible interconnections between the logical elements in a particular way, so that the device performs a particular desired set of functions.

In order to allow the required interconnections to be made, the programmable logic device includes a routing structure. The routing structure allows communication between the different logic elements in the array.

After manufacture of the programmable logic device, functions are allocated to the logic elements, and the interconnections between the logic elements are programmed, in such a way that the device performs its intended overall function.

The data which causes the logic elements to perform the intended functions, and which causes the intended interconnections to be made, is referred to as 'configuration data', and is typically stored in a separate configuration memory device. Then, when power is first supplied to the device, the configuration data is loaded from the configuration memory into the device, which is then ready to perform its intended functions.

It is known in the field of integrated circuit design that the overall power consumption of a device can be reduced by removing power supplies from presently inactive parts of the device. When a part of an integrated circuit device is connected to its power supply, there will always be some current leakage, using conventional technologies, and hence some power consumption within that part of the device. This power consumption can be avoided by powering down the unused parts of the device.

There are many applications of integrated circuit devices, in which it is highly desirable to reduce the power consumption. For example, in the case of battery-powered devices, the available operating time of the device is determined directly by the power consumption. In other cases, a high power consumption requires that the equipment be provided with special heat dissipating elements, adversely affecting the size and cost of the equipment.

However, simply powering down a programmable logic device has the serious disadvantage that, when the device is next required to be functional, it is necessary to perform a potentially lengthy configuration sequence, before the device becomes operational once more.

SUMMARY OF THE INVENTION

According to the present invention, a programmable logic device is provided with multiple power supplies such that, in one mode of operation, power can be disconnected from at least one part of the programmable logic device, while maintaining power at least to an interface component of the programmable logic device, or to a memory component in which current configuration data are stored, thereby avoiding the need for a configuration sequence when power is reapplied to the whole device.

More specifically, in preferred embodiments of the invention, the programmable logic device is provided as an integrated circuit, having multiple pairs of pins for connection to a supply voltage. Each of the pairs of pins provides power for a different subsection of the programmable logic device.

For example, the programmable logic device preferably comprises a programmable active logic section, programmable input/output devices and a configuration memory. The programmable active logic section may comprise a gate array and, in preferred embodiments of the invention, also comprises an embedded microprocessor, connected to the gate array by means of an interface. The device may have at least one mode of operation in which power is removed from some or all of the programmable active logic section of the device, while still being applied to the programmable input/output devices, or the configuration memory, or to the programmable input/output devices and the configuration memory. For example, power may be removed from the gate array of the active logic section, while still being provided to the embedded processor, or may be removed from the embedded processor of the active logic section, while still being provided to the gate array, or may be removed from both the embedded processor and the gate array of the active logic section.

While power is removed from some or all of the programmable active logic section of the device, while still being applied to the configuration memory, a reduced voltage may be applied to the configuration memory, sufficient to maintain the configuration state data in the memory.

DETAILED DESCRIPTION OF PREFERRED EMBODIMENTS

Figure 1:
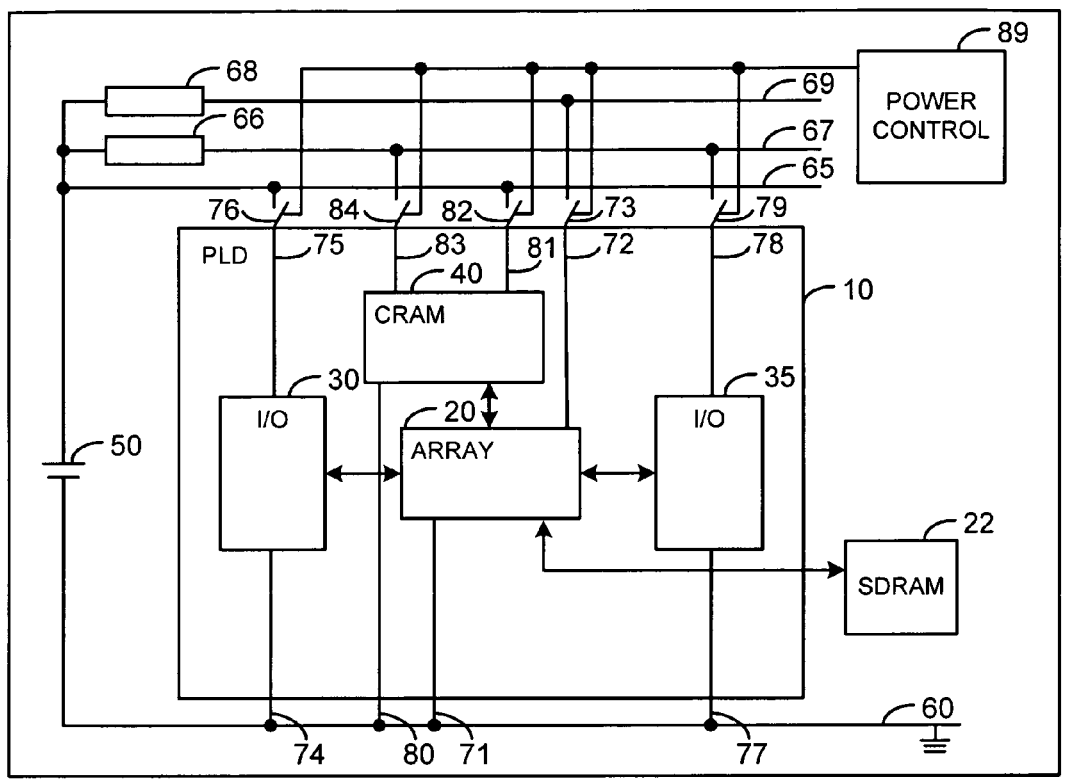
FIG. 1 is a block schematic diagram of an electronic device incorporating a first programmable logic device in accordance with the present invention.

FIG. 1 shows a programmable logic device according to a first embodiment of the invention.

As is conventional, the programmable logic device 10 is based around an active logic section in the form of a gate array 20, which is made up of programmable logic elements, plus the associated registers and other logic resources, as is conventional. The device 10 also comprises input/output blocks 30, 35, which connect the logic elements of the array 20 to the input/output pins (not shown) of the device 10.

Interconnections between the logic elements of the gate array 20, and between the logic elements and the input/output blocks 30, 35, are controlled by configuration data. The function of the configuration data is to control these interconnections so that the device 10 performs its intended function. The configuration data is stored in a configuration memory (or configuration RAM, or CRAM) 40. The stored data can then be applied to the logic elements 20 and the input/output blocks 30, 35.

FIG. 1 shows a programmable logic device 10 powered by a battery 50, although it will be appreciated by the person of ordinary skill in the art that it might equally be powered by a mains supply with an appropriate adapter. The battery 50 is connected between two rails 60, 65, with a first power supply rail 60 being connected to ground, and a second power supply rail 65 carrying a first positive supply voltage. The battery 50 is also connected through a first voltage drop block 66 to a third power supply rail 67, which therefore carries a second positive supply voltage, which is lower than the first positive supply voltage. The battery 50 is also connected through a second voltage drop block 68 to a fourth power supply rail 69, which therefore carries a third positive supply voltage, which is also lower than the first positive supply voltage, and is different from the second positive supply voltage.

Although FIG. 1 schematically shows voltage drop blocks 66, 68 for providing the reduced second and third positive supply voltages, other circuits for providing such voltages are well known to the person of ordinary skill in the art.

In this illustrated embodiment of the present invention, the gate array 20 is connected to the first and fourth power supply rails 60, 69 by respective first and second connections 71, 72, with a switch 73 in the second connection 72. The first input/output block 30 is connected to the first and second power supply rails 60, 65 by respective first and second connections 74, 75, with a switch 76 in the second connection 75. The second input/output block 35 is connected to the first and third power supply rails 60, 67 by respective first and second connections 77, 78, with a switch 79 in the second connection 78. The configuration memory 40 is connected to the first and second power supply rails 60, 65 by respective first and second connections 80, 81, with a switch 82 in the second connection 81, and is also connected to the third power supply rail 67 by a third connection 83, with a switch 84 in the third connection 83.

Thus, power supply rails are provided at different power supply voltages, and the different elements of the device can be connected to the power supply voltage which is required by their respective designs and process technologies. For the purposes of an illustrative example only, the first positive supply voltage on the second power supply rail 65 could be 3.3 volts, the second positive supply voltage on the third power supply rail 67 could be 2.5 volts, and the third positive supply voltage on the fourth power supply rail 69 could be 1.8 volts. Other arrangements could be provided with different numbers of positive supply voltages.

In the illustrated embodiment of the invention shown in FIG. 1, the connections 71, 72, 74, 75, 77, 78, 80, 81, 83 pass through separate respective pins (not shown) on the programmable logic device 10 to the power supply rails, which are not provided on the programmable logic device itself, but in some larger device 90, of which the programmable logic device is a component. The switches 73, 76, 79, 82, 84 are provided within this larger device, and operate under the control of a power control logic block 89.

It will be noted that, although FIG. 1 shows switches 73, 76, 79, 82, 84 as physical switches controlled by the power control logic block 89, other ways of achieving the required connection and disconnection of the relevant parts of the programmable logic device from the power supply are possible within the scope of the invention.

Figure 2:
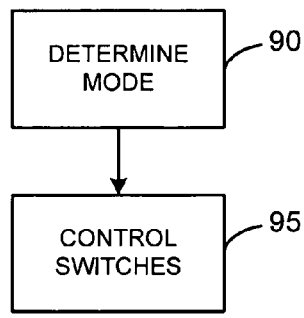
FIG. 2 is a flow chart illustrating a method of operation of the device of FIG. 1.

FIG. 2 is a flow chart illustrating a method of operation of the device of FIG. 1. In this illustrated embodiment, the device has four modes of operation and, in step 90, it is determined which mode is appropriate at that time. After determining the desired mode in step 90, the process passes to step 95, in which the power control logic block 89 operates to control the switches 73, 76, 79, 82, 84, so that power can be applied as intended to the gate array 20, the first and second input/output blocks 30, 35 and the configuration memory 40.

In a first mode of operation, the programmable logic device is fully operational, with the switches 73, 76, 79, 82 all closed, and the switch 84 open, so that power can be applied to the gate array 20, and the first and second input/output blocks 30, 35 from their respective power supply rails, and power can be applied to the configuration memory 40 from the second power supply rail 65.

In a second mode of operation, the switches 76, 79, are closed, so that power can be applied to the first and second input/output blocks 30, 35, but the switch 73 is open, so that power is not applied to the gate array 20. Thus, the gate array 20 is powered down.

In this preferred embodiment of the invention, while power is not being applied to the gate array 20, a reduced voltage is applied to the configuration memory 40. Thus, in this second mode of operation, the switch 84 is closed and the switch 82 is open, so that power is applied to the configuration memory 40 from the third power supply rail 67 rather than the second power supply rail 65. The reduced voltage on the third power supply rail 67 is sufficient to maintain the state of the data in the configuration memory 40, without being sufficient to power normal operation of the device.

In a third mode of operation, the switches 76, 79 are closed, so that power can be applied to the first and second input/output blocks 30, 35, but the switches 73, 82, 84 are open, so that power is not applied to the gate array 20 or the configuration memory 40. Thus, in this mode, the state of the output signals in the input/output blocks 30, 35 is maintained while the gate array 20 is powered down.

In a fourth mode of operation, the programmable logic device is fully powered down, with the switches 73, 76, 79, 82, 84 all open, so that no power can be applied to the gate array 20, the first and second input/output blocks 30, 35 or the configuration memory 40. This corresponds to the case where power is removed from the programmable logic device 10. This has the advantage that there is effectively no power consumption, but there is the disadvantage that the device must be reconfigured before use. This mode may therefore be appropriate when there is a particular advantage in reducing power consumption as far as possible, and the delay associated with this reconfiguration is acceptable.

Thus, there is a particular advantage in the availability of the second mode, described above, in which power is removed from the gate array 20, but the first and second input/output blocks 30, 35 and the configuration memory 40 remain powered up. Specifically, while the device is not immediately operational, the power consumption of the gate array 20 can be reduced to zero, but a reconfiguration is not required when powering up the gate array, because the input/output blocks 30, 35 and the configuration memory 40 remained powered up, albeit at a reduced voltage.

Further, in the case of the third mode, described above, there is the advantage that the state of the outputs in the input/output blocks 30, 35 is maintained, thereby avoiding any impact on surrounding logic devices, even though a reconfiguration is required when powering up the gate array.

In order to ensure that there is no unwanted state change in those interfaces of the input/output blocks 30, 35 connected to the gate array 20, during the period when the gate array is powered down, those interfaces are preferably controlled by an enable signal. That is, an enable signal is asserted before the power supply is removed from the gate array 20, and is de-asserted when the power supply to the gate array 20 has been reinstated. The de-assertion of the enable signal can be triggered by a reset signal sent from the gate array 20 when it is initially powered up, or it can be programmed to occur a predetermined number of clock cycles after the power up is initiated.

The effect of the enable signal is to prevent changes to the state of the relevant interfaces while the enable signal is asserted, and therefore to ensure that the last valid state of the interfaces, before power is removed from the gate array, is maintained.

In the illustrated preferred embodiment of the invention, means are also provided to ensure that the state of the internal registers of the gate array is also preserved while the gate array is powered down. In this embodiment, a low power memory device, such as a SDRAM memory device 22 is provided. When power is about to be removed from the gate array 20, the state of the registers can be read out of the gate array 20 and stored in the SDRAM 22. Then, when power is reapplied to the device, the state information can be read out of the SDRAM 22, and reloaded into the registers of the gate array 20.

Figure 3:
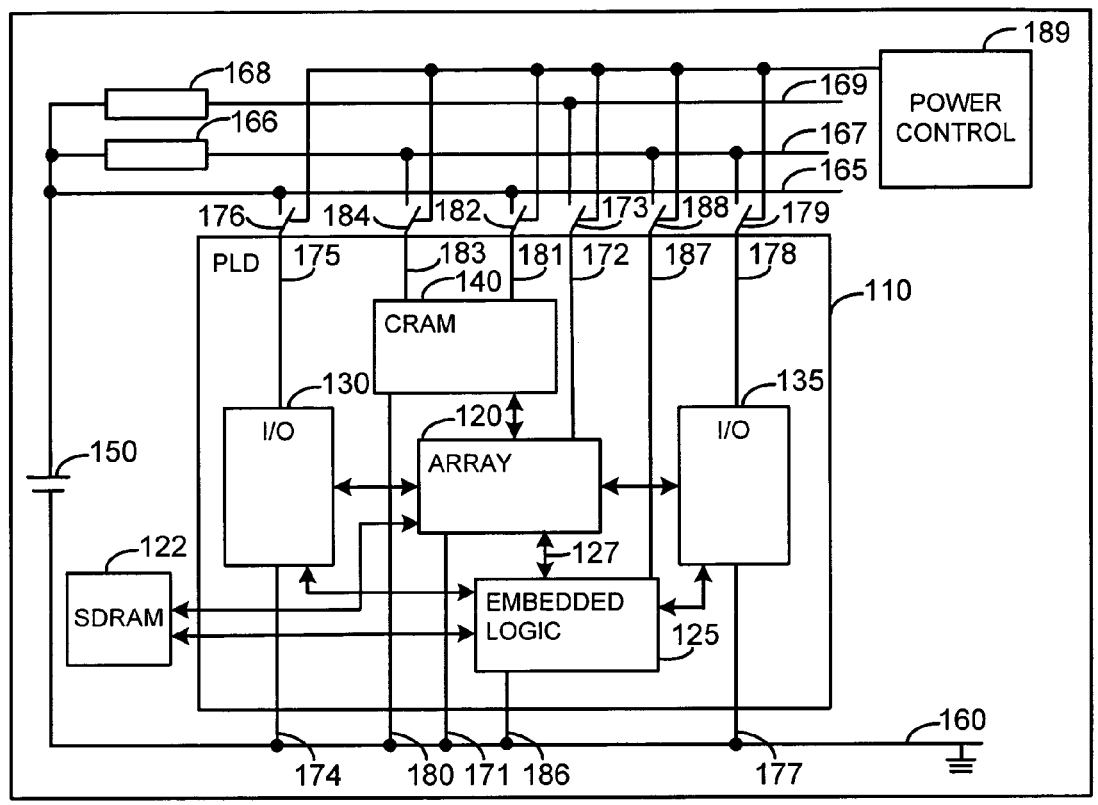
FIG. 3 is a block schematic diagram of an electronic device incorporating a second programmable logic device in accordance with the present invention.

FIG. 3 shows a programmable logic device according to a second embodiment of the invention.

Again, the programmable logic device 110 includes a gate array 120, which is made up of programmable logic elements, plus the associated registers and other logic resources. In this case, the active logic section of the device also includes an embedded logic block 125, which in a preferred embodiment of the invention includes an embedded processor and its associated registers, etc, which is provided to allow the device to perform specific processing functions more efficiently than can be achieved by a gate array alone. The embedded logic block may be programmable, or may be hard-wired to carry out specific functionality. The embedded logic block 125 is connected to the gate array 120 by means of an interface 127. The device 110 also comprises input/output blocks 130, 135, which connect the logic elements of the array 120 and embedded logic block 125 to the input/output pins (not shown) of the device 110.

Interconnections between the logic elements of the gate array 120, and between the logic elements and the embedded logic block 125, and between the logic elements and the input/output blocks 130, 135, are controlled by configuration data. The function of the configuration data is to control these interconnections so that the device 110 performs its intended function. The configuration data is stored in a configuration memory (or configuration RAM, or CRAM) 140. The stored data can then be applied to the logic elements 120 and the input/output blocks 130, 135.

FIG. 3 shows a programmable logic device 110 powered by a battery 150, although it will be appreciated by the person of ordinary skill in the art that it might equally be powered by a mains supply with an appropriate adapter. The battery 150 is connected between two rails 160, 165, with a first power supply rail 160 being connected to ground, and a second power supply rail 165 carrying a positive supply voltage. The battery 150 is also connected through a first voltage drop block 166 to a third power supply rail 167, which therefore carries a second positive supply voltage, which is lower than the first positive supply voltage. The battery 150 is also connected through a second voltage drop block 168 to a third power supply rail 169, which therefore carries a third positive supply voltage, which is also lower than the first positive supply voltage and is different from the second positive supply voltage.

Although FIG. 3 schematically shows voltage drop blocks 166, 168 for providing the reduced second and third positive supply voltages, other circuits for providing such voltages are well known to the person of ordinary skill in the art.

In this illustrated embodiment of the present invention, the gate array 120 is connected to the first and fourth power supply rails 160, 169 by respective first and second connections 171, 172, with a switch 173 in the second connection 172. The first input/output block 130 is connected to the first and second power supply rails 160, 165 by respective first and second connections 174, 175, with a switch 176 in the second connection 175. The second input/output block 135 is connected to the first and third power supply rails 160, 167 by respective first and second connections 177, 178, with a switch 179 in the second connection 178. The configuration memory 140 is connected to the first and second power supply rails 160, 165 by respective first and second connections 180, 181, with a switch 182 in the second connection 181, and is also connected to the third power supply rail 167 by a third connection 184, with a switch 184 in the third connection 183. The embedded logic block 125 is connected to the first and third power supply rails 160, 167 by respective first and second connections 186, 187, with a switch 188 in the second connection 187.

Thus, power supply rails are provided at different power supply voltages, and the different elements of the device can be connected to the power supply voltage which is required by their respective designs and process technologies. For the purposes of an illustrative example only, the first positive supply voltage on the second power supply rail 165 could be 3.3 volts, the second positive supply voltage on the third power supply rail 167 could be 2.5 volts, and the third positive supply voltage on the fourth power supply rail 169 could be 1.8 volts. Other arrangements could be provided with different numbers of positive supply voltages.

In the illustrated embodiment of the invention shown in FIG. 3, the connections 171, 172, 174, 175, 177, 178, 180, 181, 183, 186, 187 pass through separate respective pins (not shown) on the programmable logic device 110 to the power supply rails, which are not provided on the programmable logic device itself, but in some larger device 190, of which the programmable logic device is a component. The switches 173, 176, 179, 182, 184, 188 are provided within this larger device, and operate under the control of a power control logic block 189.

It will be noted that, although FIG. 3 shows switches 173, 176, 179, 182, 184, 188 as physical switches controlled by the power control logic block 189, other ways of achieving the required connection and disconnection of the relevant parts of the programmable logic device from the power supply are possible within the scope of the invention.

Figure 4:
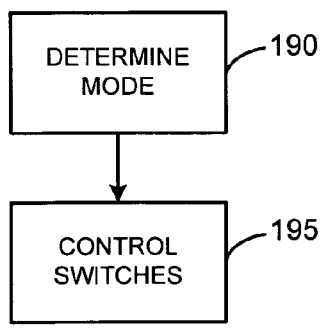
FIG. 4 is a flow chart illustrating a method of operation of the device of FIG. 3.

FIG. 4 is a flow chart illustrating a method of operation of the device of FIG. 3. In this illustrated embodiment, the device has six modes of operation and, in step 190, it is determined which mode is appropriate at that time. After determining the desired mode in step 190, the process passes to step 195, in which the power control logic block 189 operates to control the switches 173, 176, 179, 182, 184, 188, so that power can be applied as intended to the gate array 120, the embedded logic block 125, the first and second input/output blocks 130, 135 and the configuration memory 140.

In a first mode of operation, the programmable logic device is fully operational, with the switches 173, 176, 179, 182, 188 all closed, and the switch 184 open, so that power can be applied to the gate array 120, the embedded logic block 125, and the first and second input/output blocks 130, 135 from their respective power supply rails, and power can be applied to the configuration memory 140 from the second power supply rail 165.

In a second mode of operation, the switches 176, 179 are closed, so that power can be applied to the first and second input/output blocks 130, 135, but the switches 173, 188 are both open, so that power is not applied to the gate array 120 or the embedded logic block 125. Thus, in this mode, the gate array 120 and the embedded logic block 125 are powered down.

In this preferred embodiment of the invention, while power is not being applied to the gate array 120 or the embedded logic block 125, a reduced voltage is applied to the configuration memory 140. Thus, in this second mode of operation, the switch 184 is closed and the switch 182 is open, so that power is applied to the configuration memory 140 from the third power supply rail 167 rather than the second power supply rail 165. The reduced voltage on the third power supply rail 167 is sufficient to maintain the state of the data in the configuration memory 140, without being sufficient to power normal operation of the device.

In a third mode of operation, the switches 173, 176, 179, 182 are all closed, and the switch 184 is open, so that power can be applied to the gate array 120, and the first and second input/output blocks 130, 135 and power is applied to the configuration memory 140 from the second power supply rail 165. However, the switch 188 is open, so that power is not applied to the embedded logic block 125. Thus, in this mode, the gate array 120 can continue to operate, while the embedded logic block 125 is powered down.

In a fourth mode of operation, the switches 176, 179, 182, 188 are all closed, and the switch 184 is open, so that power can be applied to the embedded logic block 125, and the first and second input/output blocks 130, 135 and power is applied to the configuration memory 140 from the second power supply rail 165. However, the switch 173 is open, so that power is not applied to the gate array 120. Thus, in this mode, the gate array 120 is powered down, while the embedded logic block 125 can continue to operate.

In a fifth mode of operation, the switches 176, 179 are closed, so that power can be applied to the first and second input/output blocks 130, 135, but the switches 173, 182, 184, 188 are open, so that power is not applied to the gate array 120, the embedded logic block 125 or the configuration memory 140.

In a sixth mode of operation, the programmable logic device is fully powered down, with the switches 173, 176, 179, 182, 184, 188 all open, so that no power can be applied to the gate array 120, the embedded logic block 125, the first and second input/output blocks 130, 135 or the configuration memory 140. This corresponds to the case where power is removed from the programmable logic device 110. This has the advantage that there is effectively no power consumption, but there is the disadvantage that the device must be reconfigured before use. This mode may therefore be appropriate when there is a particular advantage in reducing power consumption as far as possible, and the delay associated with this reconfiguration is acceptable.

Thus, there is a particular advantage in the availability of the second mode, described above, in which power is removed from the gate array 120 and the embedded logic block 125, but the first and second input/output blocks 130, 135 and the configuration memory 140 remain powered up. Specifically, while the device is not immediately operational, the power consumption of the gate array 120 and the embedded logic block 125 can be reduced to zero, but a reconfiguration is not required when powering up the gate array, because the input/output blocks 130, 135 and the configuration memory 140 remained powered up, albeit at a reduced voltage.

Further, in the case of the fifth mode, described above, there is the advantage that the state of the outputs in the input/output blocks 130, 135 is maintained, thereby avoiding any impact on surrounding logic devices, even though a reconfiguration is required when powering up the gate array and the embedded logic block.

Compared with the FIG. 1 embodiment, this embodiment of the invention has the further advantage arising from the third and fourth modes, described above, namely that power can be removed from the embedded logic block 125 while still allowing full operation of the gate array 120, or can be removed from the gate array 120 while still allowing full operation of the embedded logic block 125, depending on the existing application of the device. This means that the programmable logic device 110 has the advantage of the additional functionality of the embedded logic block 125, without the penalty of its power consumption at times when that additional functionality is not being used.

Further, at times when there are particularly tight restrictions on the permissible power consumption, it may be possible to enter the third mode of operation, removing power from the embedded logic block 125, and to cause the gate array 120 to perform some function that would otherwise be performed by the embedded logic block 125. This will likely reduce the performance of the device, but this may be more acceptable than exceeding some specified maximum power consumption.

As in the FIG. 1 embodiment, in order to ensure that there is no unwanted state change in those interfaces of the input/output blocks 130, 135 connected to the gate array 120 and/or the embedded logic block 125, during the period when the gate array and/or the embedded logic block is powered down, those interfaces are preferably controlled by an enable signal. That is, an enable signal is asserted before the power supply is removed from the gate array 120 and/or embedded logic block 125, and is de-asserted when their power supply has been reinstated. The de-assertion of the enable signal can be triggered by a reset signal sent from the gate array 120 when it is initially powered up, or it can be programmed to occur a predetermined number of clock cycles after the power up is initiated.

The effect of the enable signal is to prevent changes to the state of the relevant interfaces while the enable signal is asserted, and therefore to ensure that the last valid state of the interfaces, before power is removed from the gate array and/or the embedded logic block, is maintained.

In a further embodiment of the invention, means are also provided to ensure that the state of the internal registers of the gate array and the embedded logic block is also preserved while they are powered down. In this further embodiment, a low power memory device 122, such as a SDRAM memory device is provided. When power is about to be removed from the gate array 120 and the embedded logic block 125, the state of the registers can be read out of the gate array 120 and the embedded logic block 125 and stored in the SDRAM 122. Then, when power is reapplied to the device, the state information can be read out of the SDRAM 122, and reloaded into the registers of the gate array 120 and the embedded logic block 125.

In a further modification of either the first or second embodiment of the invention, different parts of the input/output blocks 30, 35 or 130, 135 can be provided with separate power supplies. For example, some parts of one or more of the input/output blocks 30, 35 or 130, 135 may require a 2.5 volt supply, while other parts may require a 3.3 volt supply. In such a case, power can be maintained to one of these groups of parts at a time when power is disconnected from the other group of parts. Alternatively, or additionally, different parts of the gate array 120 and/or the embedded logic block 125 can be provided with separate power supplies, and these can be separately connected to, or disconnected from, their respective power supplies.

Also, in a further modification of the second embodiment of the invention, different parts of the input/output blocks 130, 135 can be provided for the gate array 120 and for the embedded logic block 125. In that case, when power is maintained to the gate array 120 but disconnected from the embedded logic block 125, or vice versa, power can be supplied only to those parts of the input/output blocks 130, 135 which are connected to the block to which power is maintained.

The invention therefore provides a method and a device for providing the required functionality of a programmable logic device, while allowing the power consumption of the device to be maintained at acceptable levels.

The invention claimed is:

1. A programmable logic device, comprising:
  an active logic section and a configuration memory, wherein the active logic section and the configuration memory have separate power supply connections, wherein the active logic section comprises a gate array; and wherein the active logic section further comprises an embedded logic device, and the gate array and the embedded logic device have separate power supply connections.

2. A programmable logic device as claimed in claim 1, wherein the logic device comprises an embedded processor.

3. A programmable logic device, comprising:
  an active logic section and a configuration memory, wherein the active logic section and the configuration memory have separate power supply connections; and further comprising a programmable input/output section, wherein the programmable input/output section has a further separate power supply connection, wherein each of the separate power supply connections for the active logic section, the configuration memory, and the programmable input/output section are selectable between at least two different voltage levels.

4. A programmable logic device integrated circuit, having a plurality of pins for connection to respective other devices, the programmable logic device integrated circuit comprising:
  an active logic section and a configuration memory, wherein the active logic section is connected to at least a first pair of said pins to receive power therefrom, and the configuration memory is connected to a second pair of said pins different from the first to receive power therefrom, wherein the active logic section comprises a gate array, wherein the active logic section further comprises an embedded logic device, and the gate array is connected to said first pair of said pins to receive power therefrom, and the embedded logic device is connected to a third pair of said pins different from the first to receive power therefrom.

5. A programmable logic device integrated circuit as claimed in claim 4, wherein the embedded logic device further comprises an embedded processor.

6. A programmable logic device integrated circuit, having a plurality of pins for connection to respective other devices, the programmable logic device integrated circuit comprising an active logic section and a configuration memory, wherein the active logic section is connected to at least a first pair of said pins to receive power therefrom, and the configuration memory is connected to a second pair of said pins different from the first to receive power therefrom, further comprising a programmable input/output section, wherein the programmable input/output section is connected to a fourth pair of said pins different from the first and second to receive power therefrom.

7. In a programmable logic device, comprising:
  an active logic section and a configuration memory, a method comprising operating the device in a first mode of operation, in which power is supplied to the configuration memory and power is disconnected from the active logic section, wherein the active logic section comprises a gate array and an embedded logic device, the method further comprising operating the device in a second mode of operation, in which power is supplied to the gate array of the active logic section and power is disconnected from the embedded logic device.

8. In a programmable logic device, comprising an active logic section and a configuration memory, a method comprising:
  operating the device in a first mode of operation, in which power is supplied to the configuration memory and power is disconnected from the active logic section, wherein the programmable logic device further comprises a programmable input/output section, wherein, in the first mode of operation, power is supplied to the programmable input/output section wherein the power supplied to the configuration memory and to the programmable input/output section comprises at least two selectable voltage levels.

9. In a programmable logic device, comprising:
  an active logic section and a configuration memory, a method comprising operating the device in a first mode of operation, in which power is supplied to the configuration memory and power is disconnected from the active logic section, the method further comprising operating the device in a normal mode of operation, in which power is supplied to the configuration memory and to the active logic section, wherein the power supplied to the active logic section and to the programmable input/output section comprises at least two selectable voltage levels.

10. A method as claimed in claim 9, the method further comprising supplying a first voltage to the configuration memory in said normal mode of operation and supplying a second voltage, lower than said first voltage, to the configuration memory in said first mode of operation.

11. In a programmable logic device, comprising:
  an active logic section and a configuration memory, a method comprising operating the device in a first mode of operation, in which power is supplied to the configuration memory and power is disconnected from the active logic section, further comprising:
    before entering said first mode of operation, storing data from registers of said active logic section in a memory device separate from said programmable logic device; and
    after completing said first mode of operation retrieving said data, stored in said separate memory device, into the registers of said active logic section.

12. An electronic device comprising:
  a power supply and a programmable logic device integrated circuit, wherein the power supply comprises a plurality of power supply rails, and the programmable logic device integrated circuit comprises an active logic section and a configuration memory, wherein the active logic section is connected to a first pair of said power supply rails through a first pair of said pins on said integrated circuit to receive power therefrom, and the configuration memory is connected to a second pair of said power supply rails through a second pair of said pins different from the first to receive power therefrom, wherein the power supply comprises a plurality of power supply rails at different respective voltages, and the active logic section and the configuration memory are connected to power supply rails at different respective voltages.

13. An electronic device comprising:
a power supply and a programmable logic device integrated circuit, wherein the power supply comprises a plurality of power supply rails, and the programmable logic device integrated circuit comprises an active logic section and a configuration memory, wherein the active logic section is connected to a first pair of said power supply rails through a first pair of said pins on said integrated circuit to receive power therefrom, and the configuration memory is connected to a second pair of said power supply rails through a second pair of said pins different from the first to receive power therefrom, wherein the active logic section of the programmable logic device integrated circuit comprises a gate array, wherein the active logic section of the programmable logic device integrated circuit further comprises an embedded logic device, and the gate array is connected to said first pair of said pins on said integrated circuit to receive power therefrom, and the embedded logic device is connected to a third pair of said pins on said integrated circuit different from the first pair to receive power therefrom.

14. An electronic device comprising:
a power supply and a programmable logic device integrated circuit, wherein the power supply comprises a plurality of power supply rails, and the programmable logic device integrated circuit comprises an active logic section and a configuration memory, wherein the active logic section is connected to a first pair of said power supply rails through a first pair of said pins on said integrated circuit to receive power therefrom, and the configuration memory is connected to a second pair of said power supply rails through a second pair of said pins different from the first to receive power therefrom, wherein the programmable logic device integrated circuit further comprises a programmable input/output section, and wherein the programmable input/output section is connected to a fourth pair of said pins on said integrated circuit different from the first and second pairs to receive power therefrom.

15. An electronic device as claimed in claim 12, wherein said configuration memory is connected to power supply rails at two different voltages.

16. An electronic device as claimed in claim 15, wherein, when the active logic section is connected to said first pair of said power supply rails through said first pair of said pins on said integrated circuit to receive power therefrom, the configuration memory is connected to said second pair of said power supply rails through said second pair of said pins different from the first to receive power therefrom, and, when the active logic section is disconnected from said first pair of said power supply rails, the configuration memory is connected to a third pair of said power supply rails through a fifth pair of said pins to receive power therefrom at a reduced voltage.

17. An electronic device as claimed in claim 16, further comprising a memory device, wherein, when said active logic section is to be disconnected from said first pair of said power supply rails, data stored in registers of said active logic section is transferred to said memory device.

18. A programmable logic circuit comprising:
an active logic section having a selectable power supply connection;
a configuration memory having a selectable power supply connection;
a gate array having a selectable power supply connection;
a power control circuit configured to operate each of the selectable power supply connections to selectively supply different power supply voltages to the active logic circuit, the configuration memory, and the gate array in response to a predetermined mode of operation.

19. The programmable logic circuit of claim 18, wherein the different power supply voltages comprise power supply rails that each provide a different power supply voltage to the programmable logic circuit.

20. The programmable logic circuit of claim 18, wherein each of the selectable power supply connection comprises at least one switch operable by the power control circuit.

21. The programmable logic circuit of claim 18, wherein when the mode of operation is a low power mode, the power control circuit connects a reduced voltage to the configuration memory and connects no power to the gate array.

22. The programmable logic circuit of claim 18, wherein when the mode of operation is a low power mode, the power control circuit connects a voltage to one or more input/output blocks but does not supply a voltage to the gate array or to the configuration memory.

23. The programmable logic circuit of claim 22, wherein the power control circuit provides an enable signal to one or more input/output blocks to maintain a state of the input/output blocks with respect to power supplied to the gate array.

24. The programmable logic circuit of claim 22, wherein the enable signal is asserted to maintain a state of the input/output blocks when the gate array is supplied no power.

25. The programmable logic circuit of claim 22, wherein the enable signal is de-asserted to allow a state change of the input/output blocks when the gate array is supplied power.

* * * * *